United States Patent
Edwards et al.

(10) Patent No.: US 9,679,762 B2
(45) Date of Patent: Jun. 13, 2017

(54) ACCESS CONDUCTIVITY ENHANCED HIGH ELECTRON MOBILITY TRANSISTOR

(71) Applicant: Toshiba Corporation, Tokyo (JP)

(72) Inventors: Andrew Paul Edwards, San Jose, CA (US); Xinyu Zhang, Palo Alto, CA (US); Yan Zhu, Livermore, CA (US)

(73) Assignee: Toshiba Corporation, Tokyo (JP)

( * ) Notice: Subject to any disclaimer, the term of this patent is extended or adjusted under 35 U.S.C. 154(b) by 0 days.

(21) Appl. No.: 14/660,124

(22) Filed: Mar. 17, 2015

(65) Prior Publication Data

US 2016/0276473 A1 Sep. 22, 2016

(51) Int. Cl.

| | |
|---|---|
| *H01L 29/778* | (2006.01) |
| *H01L 21/02* | (2006.01) |
| *H01L 29/66* | (2006.01) |
| *H01L 29/20* | (2006.01) |
| *H01L 29/423* | (2006.01) |

(52) U.S. Cl.
CPC .. *H01L 21/02178* (2013.01); *H01L 29/66462* (2013.01); *H01L 29/7786* (2013.01); *H01L 29/2003* (2013.01); *H01L 29/4236* (2013.01)

(58) Field of Classification Search
CPC ........... H01L 21/02178; H01L 21/0254; H01L 29/7787; H01L 29/2003; H01L 29/517; H01L 29/66462; H01L 29/205
See application file for complete search history.

(56) References Cited

U.S. PATENT DOCUMENTS

| | | | | |
|---|---|---|---|---|
| 6,255,166 | B1 * | 7/2001 | Ogura | H01L 21/28202 257/E21.21 |
| 8,525,274 | B2 * | 9/2013 | Takada | H01L 23/291 257/410 |
| 2009/0267078 | A1 * | 10/2009 | Mishra | H01L 29/2003 257/76 |
| 2011/0006346 | A1 * | 1/2011 | Ando | H01L 29/4236 257/192 |
| 2011/0140169 | A1 * | 6/2011 | Briere | H01L 21/28587 257/192 |
| 2012/0138899 | A1 * | 6/2012 | Nainani | H01L 29/66462 257/24 |
| 2012/0319169 | A1 * | 12/2012 | Van Hove | H01L 23/291 257/194 |
| 2013/0105817 | A1 * | 5/2013 | Saunier | H01L 29/778 257/77 |

(Continued)

OTHER PUBLICATIONS

Kanamura et al., "Enhancement-Mode GaN MIS-HEMTS With Triple Cap Layer and High-k Gate Dielectrics", IEEE Electron Device Letters, Mar. 2010, vol. 31 No. 3.

*Primary Examiner* — Allan R Wilson
(74) *Attorney, Agent, or Firm* — White & Case LLP (57) ABSTRACT

A high electron mobility transistor (HEMT) device with enhanced conductivity in the transistor's non-gated access regions and a method for making the HEMT device is disclosed. In one embodiment, the HEMT device includes a heterojunction comprising a barrier layer formed on a channel layer. One or more intervening layers comprising a material suitable for increasing a fixed charge at the heterojunction is formed on a substantially planar surface of the barrier layer opposite the channel layer in the non-gated access region.

23 Claims, 6 Drawing Sheets

(56) References Cited

U.S. PATENT DOCUMENTS

| | | | |
|---|---|---|---|
| 2013/0105863 A1* | 5/2013 | Lee | H01L 29/42364 257/194 |
| 2014/0264367 A1* | 9/2014 | Banerjee | H01L 29/66431 257/76 |
| 2015/0255547 A1* | 9/2015 | Yuan | H01L 29/7788 257/76 |
| 2016/0020313 A1* | 1/2016 | Wu | H01L 29/7786 257/194 |
| 2016/0064539 A1* | 3/2016 | Lu | H01L 29/66462 257/76 |

* cited by examiner

ACCESS CONDUCTIVITY ENHANCED HIGH ELECTRON MOBILITY TRANSISTOR

FIELD OF THE INVENTION

The invention relates generally to high electron mobility transistors (HEMTs), and particularly to HEMTs with enhanced conductivity in the transistor's non-gated access regions.

BACKGROUND OF THE INVENTION

The high electron mobility transistor (HEMT) is a type of field effect transistor (FET) having a heterojunction between a channel layer and a barrier layer whose electron affinity is smaller than that of the channel layer. A group III-N HEMT device is one made of elements in column III of the periodic table, such as aluminum (Al), gallium (Ga), and indium (In), and nitrogen (N) in column V of the periodic table. A two-dimensional electron gas (2DEG) forms in the channel layer of a group III-N HEMT device due to a polarization induced charge at the channel-barrier layer interface. The 2DEG has a high electron mobility that facilitates low channel resistance and high-speed switching during device operation.

In typical HEMT devices, the 2DEG arises naturally at the interface of the III-N materials forming the heterojunction, meaning the typical HEMT device will conduct in the absence of a gate potential. In other words, the typical HEMT device is a normally "on" device. A negatively-biased voltage may be applied to the gate electrode to deplete the 2DEG and thereby turn off the device. Accordingly, the typical HEMT device is also referred to as a "depletion-mode" HEMT.

Figure 1:
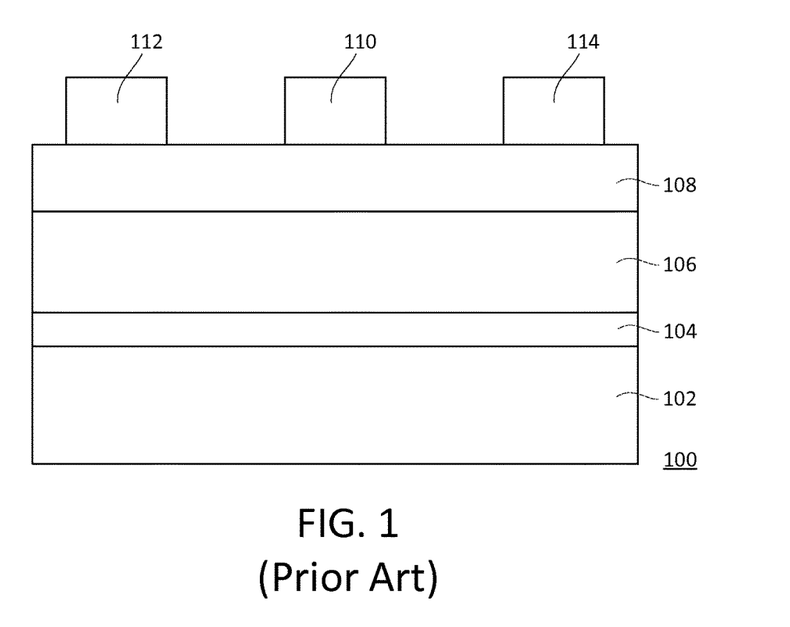
FIG. 1 shows a cross-sectional view of a prior art structure for a depletion-mode HEMT device.

FIG. 1 shows a cross-sectional view of a prior art structure for a depletion-mode HEMT device. The HEMT device 100 shown in FIG. 1 begins with substrate 102. An optional buffer layer 104, also known as a nucleation layer, can be deposited on substrate 102 to provide a surface on which high-quality gallium nitride (GaN) may be grown. Epitaxial growth of gallium nitride (GaN) forms a channel layer 106 on buffer layer 104.

Next, a barrier layer 108, is formed on channel layer 106. Barrier layer 108 comprises a material suitable to form a hetero-junction with the channel layer 106. Electrodes 112 and 114 formed on barrier layer 108 act as the source and drain, respectively, of the HEMT device 100. Source and drain electrodes 112 and 114 may comprise any suitable material that forms an ohmic contact with the barrier layer 108. Gate electrode 110 is also formed on barrier layer 108, between the source electrode 112 and drain electrode 114. Gate electrode 110 comprises a material that forms a non-ohmic contact (a contact which does not exhibit linear I-V characteristics) with the barrier layer 108.

During device operation of the foregoing HEMT device 100, a 2DEG forms on the channel layer side of the interface between channel layer 106 and barrier layer 108, allowing current to flow between the source electrode 112 and the drain electrode 114. A negative voltage (relative to substrate 102) may be applied to gate electrode 110 to deplete the 2DEG and shut off the flow of current between the source electrode 112 and the drain electrode 114, turning off the HEMT device 100.

Group III-N HEMT devices exhibit a number of desirable characteristics, including high breakdown voltage, high current density, high electron velocity, and low on resistance, making them particularly suited for high power and high frequency applications. However, the typical depletion-mode HEMT device's normally on state makes it unsuitable for many applications as the depletion-mode HEMT conducts current before other circuitry is fully powered and operational.

To resolve this issue, a number of different approaches have been explored to create a normally "off", or enhancement-mode, HEMT device. One conventional approach is to heavily p+ dope a semiconductor gate to form a P-N junction with the underlying barrier layer. However, the P-N junction has a high current leakage resulting in increased power consumption and heat generation, both undesirable transistor characteristics. Another conventional approach is disclosed by Kanamura et al., *Enhancement-Mode GaN MIS-HEMTS with n-GaN/i-AlN/n-GaN Triple Cap Layer and High-k Gate Dielectrics*, IEEE Electron Device Letters, Vol. 31, No. 3 (March 2010), which is incorporated herein by reference. Kanamura et al. discloses the use of a recessed gate structure to shift the threshold voltage of the HEMT device positive. To form the recessed gate structure of Kanamura et al., the barrier layer must be etched to a precise depth in order to obtain a desired threshold voltage.

Precise etching of the barrier layer was attempted by Kanamura et al., however etching the barrier layer is generally considered unsuitable for large-scale manufacturing where variations occur across a wafer during each processing step, making it difficult to precisely control the etching depth of the barrier layer for each HEMT device formed on the wafer. An HEMT device formed on one corner of the wafer using the method disclosed by Kanamura et al. will have a drastically different threshold voltage compared to another HEMT device formed on the opposite corner of the wafer—making the HEMT device unsuitable for most modern applications which require relatively precise and consistent transistor characteristics to properly function.

There is, therefore, an unmet demand for enhancement-mode HEMT devices having enhanced conductivity and that are suitable for large-scale manufacturing.

BRIEF DESCRIPTION OF THE INVENTION

In one embodiment, a high electron mobility transistor (HEMT) device has a heterojunction comprising a barrier layer formed on a channel layer. The channel layer comprises a group III-V material. In one embodiment, the channel layer comprises a group III-nitride material. In one embodiment, the channel layer is gallium nitride (GaN). In other embodiments, the channel layer comprises low aluminum (Al) percentage aluminum gallium nitride (AlGaN), indium gallium nitride (InGaN), or other suitable group III-nitride compounds. The barrier layer comprises a material suitable for forming a heterojunction with the channel layer. In one embodiment, the barrier layer is aluminum gallium nitride (AlGaN). In other embodiments, the barrier layer comprises aluminum nitride (AlN), indium aluminum nitride (InAlN), indium aluminum gallium nitride (InAlGaN), or any other suitable group III-nitride compounds.

The HEMT device further includes one or more intervening layers formed on a substantially planar surface of the barrier layer opposite the channel layer. The one or more intervening layers are formed in a non-gated region of the HEMT device. The one or more intervening layers comprise a material capable of increasing a fixed charge at the heterojunction of the HEMT device in the non-gated region. In one embodiment, the one or more intervening layers comprise aluminum nitride. In other embodiments, the one or more intervening layers comprises aluminum gallium nitride, indium aluminum nitride, indium aluminum gallium nitride, gallium nitride, or any other suitable group III-nitride compounds. A gate dielectric is formed on the one or more intervening layers in the non-gated region, and the barrier layer in a gated region. The gate dielectric preferably comprises a material suitable to suppress gate leakage current, improve drain current collapse, and exhibits good thermal stability. In one embodiment, the gate dielectric is aluminum oxide ($Al_2O_3$). In another embodiment, the gate dielectric is silicon nitride (SiN). Other known dielectric materials may also be suitable for forming the gate dielectric, as well as multiple layers of dielectric materials.

The HEMT device further includes a gate electrode formed on the gate dielectric in the gated region of the HEMT device, where the gate dielectric contacts the barrier layer. The gate electrode forms a non-ohmic contact with the barrier layer. Source and drain electrodes are formed on, and electrically coupled to the barrier layer in the non-gated region of the HEMT device. The source and drain electrodes form an ohmic contact with the barrier layer.

In one embodiment, a method of forming a HEMT device includes growing a channel layer comprising a group III-V material on a substrate suitable for growing such materials. In one embodiment, the channel layer is gallium nitride. In other embodiments, the channel layer comprises low aluminum percentage aluminum gallium nitride, indium gallium nitride, or other suitable group III-nitride compounds. In another embodiment, the method optionally includes depositing a buffer layer on the substrate prior to growing the channel layer, the buffer layer providing a suitable surface for growing high-quality group III-V materials. In one embodiment, the channel layer is grown using metalorganic chemical vapor deposition (MOCVD). In another embodiment, the channel layer is grown using molecular beam epitaxy (MBE).

The method further includes forming a barrier layer having a substantially uniform thickness on the channel layer, the barrier layer comprising a material suitable for forming a heterojunction with the channel layer. In one embodiment, the barrier layer comprises aluminum gallium nitride. In other embodiments, the barrier layer comprises aluminum nitride, indium aluminum nitride, indium aluminum gallium nitride, or any other suitable group III-nitride compounds. In one embodiment, the barrier layer is grown using metalorganic chemical vapor deposition (MOCVD). The method further includes forming one or more intervening layers on the barrier layer, and selectively etching away the one or more intervening layers in a gated region. The one or more intervening layers comprise materials suitable for increasing a fixed charge at the heterojunction. In one embodiment, the one or more intervening layers comprise aluminum nitride. In other embodiments, the one or more intervening layers comprises aluminum gallium nitride, indium aluminum nitride, indium aluminum gallium nitride, gallium nitride, or any other suitable group III-nitride compounds. In one embodiment, the one or more intervening layers is grown using atomic layer deposition (ALD).

In one embodiment, the method further includes depositing a metal layer over the intervening layer in the non-gated region and the barrier layer in the gated region, and using photolithography and etching or lift-off techniques to form source and drain electrodes in contact with the intervening layer and barrier layer in the non-gated region. The method further includes annealing the source and drain contacts to form an ohmic contact with the barrier layer. The method further includes forming a gate dielectric over the one or more intervening layers in the non-gated region, and over the barrier layer in the gated region and forming a gate electrode over the gate dielectric in the gated region. The gate electrode forms a non-ohmic contact with the barrier layer.

During device operation, when a positive bias voltage is applied to the gate electrode of the HEMT device, a current carrying channel (2DEG) forms at the heterojunction allowing current to flow between the source and drain electrodes. In one embodiment, the positive bias voltage is between 0V and 2V. The current carrying channel has a higher charge concentration in the non-gated region of the HEMT device than the gated-region. In one embodiment, the charge concentration of the heterojunction in the non-gated region is between $7\times10^{12}$ $cm^{-2}$ and $2\times10^{13}$ $cm^{-2}$, and the charge concentration of the heterojunction in the gated region is between 0 $cm^{-2}$ and $3\times10^{12}$ $cm^{-2}$.

DETAILED DESCRIPTION OF THE INVENTION

Figure 2:
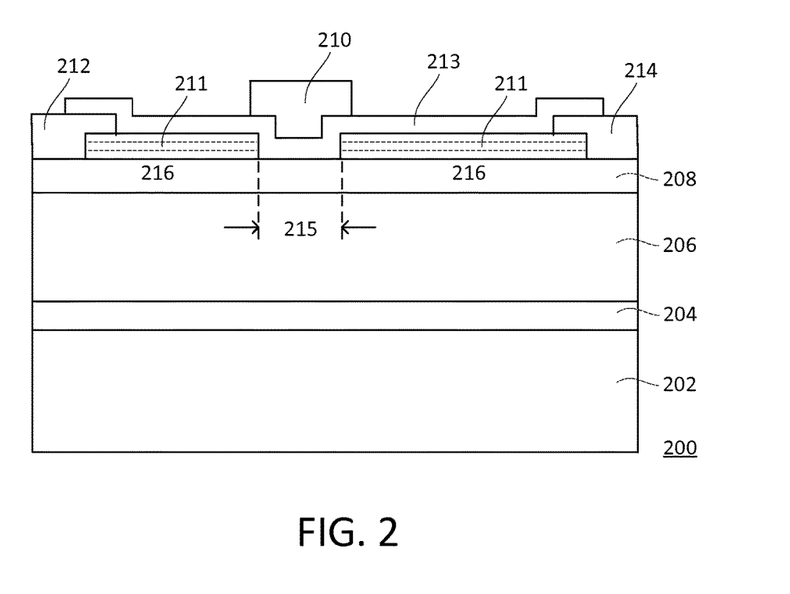
FIG. 2 shows a cross-sectional view of an enhancement-mode HEMT device according to one embodiment of the invention.

FIG. 2 shows a cross-sectional view of an enhancement-mode HEMT device according to one embodiment of the invention. In FIG. 2, a HEMT device 200 begins with substrate 202. Substrate 202 can be silicon (Si), silicon carbide (SiC), sapphire ($Al_2O_3$), bulk gallium nitride (GaN), or any other suitable substrate for epitaxially growing a group III-V material. A buffer layer 204 is deposited on substrate 202 to provide a surface suitable for growing high-quality layers of group III-V materials. Buffer layer 204 can be gallium nitride (GaN), aluminum gallium nitride (AlGaN), aluminum nitride (AlN), or any other suitable material for growing high-quality layers of group III-V materials, or combinations thereof. Buffer layer 204 is optional, and in one embodiment, subsequent layers of group III-V materials are grown directly on the substrate 202.

A channel layer 206 is formed on top of the buffer layer 204. Channel layer 206 comprises a group III-V material. A barrier layer 208 is formed on the channel layer 206. The barrier layer 208 comprises a material suitable for forming a heterojunction with the channel layer 206. The resulting difference in the polar properties between the semiconductor material of the channel layer 206 and the barrier layer 208 give rise to a fixed charge at their interface, or heterojunction. The fixed charge attracts mobile electrons in the HEMT device 200 resulting in a current carrying channel (2DEG) at the heterojunction. In one embodiment, the channel layer 206 comprises gallium nitride and the barrier layer 208 comprises aluminum gallium nitride. In another embodiment, channel layer 206 comprises low aluminum (Al) percentage aluminum gallium nitride, indium gallium nitride (InGaN), or other suitable group III-nitride compounds, and the barrier layer 208 may comprise aluminum nitride, indium aluminum nitride (InAlN), indium aluminum gallium nitride (InAlGaN), or any other suitable group III-nitride compounds.

The magnitude of the fixed charge at the heterojunction can be controlled by varying the thickness of the barrier layer 208, varying the chemical composition of the barrier layer 208, and/or varying both the thickness and the chemical composition of the barrier layer 208. In one embodiment, the barrier layer 208 is formed thinly to reduce the magnitude of the polarization induced fixed charge at the heterojunction. For example, when the channel layer 206 comprises gallium nitride and the barrier layer 208 comprises aluminum gallium nitride, the magnitude of the fixed charge can be controlled by adjusting the aluminum composition of the barrier layer 208. For example, a barrier layer 208 comprising aluminum gallium nitride having 18-21% aluminum content should be formed to a thickness of about 2-10 nm. By reducing the fixed charge at the heterojunction, the built-in potential of a gated region 215 of the HEMT device 200 is allowed to fully deplete the mobile electrons that would have been present at the heterojunction in the absence of a gate electrode 210.

The full depletion of mobile electrons at the heterojunction allows the gate electrode 210 to fully cut-off the otherwise conducting current carrying channel at the heterojunction without applying an external voltage bias. This property forms the basis for the enhancement-mode HEMT device 200. In one embodiment, the thickness of the barrier layer 208 results in a fixed charge at the heterojunction corresponding to a mobile charge concentration of between 0 cm$^{-2}$ and $3 \times 10^{12}$ cm$^{-2}$, shifting the threshold voltage to turn on the HEMT device 200 to a positive voltage relative to substrate 202. In one embodiment, the threshold voltage of the HEMT device 200 is between 0V and +2V.

However, reducing the fixed charge at the heterojunction attracts a lower concentration of mobile charge, in turn reducing the conductivity of the current carrying channel in the HEMT device 200, and decreasing the overall performance of the HEMT device 200. To compensate for the reduced conductivity, an intervening layer 211 is formed on the barrier layer in a non-gated region 216. The non-gated region 216 is the region of the HEMT device outside of a gated region 215, which in turn, is the region underlying the portion of the barrier layer 208 in contact with the gate dielectric 213. The intervening layer 211 comprises any material suitable to enhance the fixed charge at the heterojunction in the non-gated region 216, also known as the access region of the HEMT device 200. Typically, the intervening layer 211 may comprise any material suitable for the barrier layer 208, for example aluminum nitride, indium aluminum nitride, or indium aluminum gallium nitride. In one embodiment, the channel layer 206 is gallium nitride, the barrier layer 208 is aluminum gallium nitride, and the intervening layer 211 comprises aluminum nitride. In this embodiment, the aluminum nitride intervening layer 211 supplements the aluminum composition of the barrier layer 208 in the non-gated region 216, which as discussed above, contributes to the magnitude of the polarization induced fixed charge at the heterojunction resulting in a higher mobile charge concentration in the non-gated region 216 compared to the mobile charge concentration in the gated region 215. In one embodiment, the intervening layer 211 contributes to a mobile charge concentration of between $7 \times 10^{12}$ cm$^{-2}$ and $2 \times 10^{13}$ cm$^{-2}$.

In another embodiment, the intervening layer 211 comprises a plurality of layers capable of increasing the fixed charge at the heterojunction, which is represented by the dotted lines shown in intervening layer 211 in FIG. 2. For example, in one embodiment, the intervening layer 211 may comprise a layer of aluminum gallium nitride and a layer of gallium nitride. As previously discussed, increasing the fixed charge at the heterojunction will attract a higher concentration of mobile charge, increasing the conductivity of the current carrying channel of the HEMT device 200. However, because the intervening layer 211 is formed in the non-gated region 216 of the HEMT device 200, the fixed charge at the gated region 215 remains low and the HEMT device 200 remains an enhancement-mode HEMT having a positive threshold voltage.

A source electrode 212 and a drain electrode 214 are formed on, and electrically coupled to, the barrier layer 208 in the non-gated region 216 of the HEMT device 200. The source electrode 212 and the drain electrode 214 may comprise any material suitable to form an ohmic contact with the barrier layer 208, such as titanium (Ti), silicon (Si), nickel (Ni), aluminum (Al), tungsten (W), or any combination or alloy thereof. A gate dielectric 213 is formed on the intervening layer 211 in the non-gated region 216, and on the barrier layer 208 in the gated region 215. Additionally, the gate dielectric 213 may also extend over the source electrode 212 and the drain electrode 214, as shown in FIG. 2. However in some embodiments, the gate dielectric 213 is not formed on the source electrode 212 and the drain electrode 214. The gate dielectric 213 preferably comprises a material, or combination of materials, suitable to suppress gate leakage current, improve drain current collapse, and exhibit good thermal stability. In one embodiment, the gate dielectric 213 comprises aluminum oxide ($Al_2O_3$). In another embodiment, the gate dielectric 213 comprises silicon nitride (SiN). Other known dielectric materials may also be suitable for forming the gate dielectric, as well as multiple layers of dielectric materials.

A gate electrode 210 is formed on the gate dielectric 213 in the gated region 215. In one embodiment, the gate electrode 210 extends over the gate dielectric 213 into the non-gated region 216. The gate electrode 210 forms a non-ohmic contact (a contact which does not exhibit linear I-V characteristics) with the barrier layer 208. The gate electrode 210 may comprise any suitable material, including titanium, nickel, aluminum, tungsten, molybdenum (Mo), or any combination or alloy thereof. Typically, a material having a high metal work function, greater than 4.5 eV, is preferred.

When a sufficiently positive bias voltage is applied to the gate electrode 210 of the HEMT device 200, a current carrying channel forms at the heterojunction allowing current to flow between the source electrode 212 and the drain electrode 214. When the positive bias voltage is removed, the mobile electrons flowing through the current carrying channel are fully depleted due to the reduced magnitude of the polarization induced fixed charge and the built-in potential in the gated region 215, and the current carrying channel at the heterojunction is cut-off.

As described, the HEMT device 200 is an enhancement-mode, or normally-off, device with enhanced conductivity in the non-gated region 216. The thin barrier layer 208 reduces the fixed charge of the gated region 215 of the HEMT device 200, shifting the threshold voltage positive, while the intervening layer 211 increase the fixed charge in the non-gated region 216 to enhance the conductivity of the current carrying channel during device operation. Because the barrier layer 208 is formed thinly, and remains thin at the gated region 215, enhancement-mode operation of the HEMT device 200 is achieved without having to etch into the barrier layer 208 (as will be explained in greater detail in connection with FIGS. 3A-J, below) or heavily p+ dope a semiconductor gate to form a P-N junction gate structure as was necessary with prior art enhancement-mode HEMT devices. Accordingly, the HEMT device 200 has lower gate leakage under forward or reverse voltage bias conditions and is better suited for large-scale manufacturing, compared to prior art enhancement-mode HEMT devices.

Figure 3A:
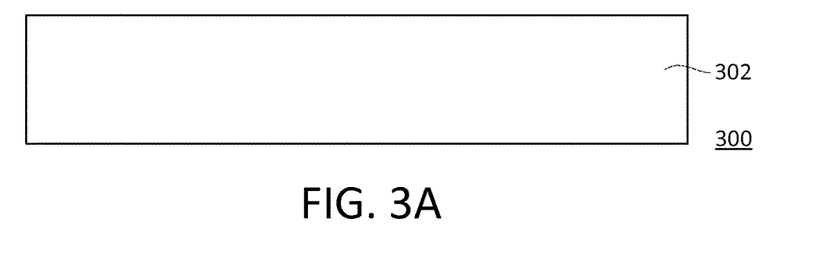
FIGS. 3A-J shows cross-sectional views of the manufacturing steps for producing an enhancement-mode HEMT device, according to one embodiment of the invention.
Figure 3B:
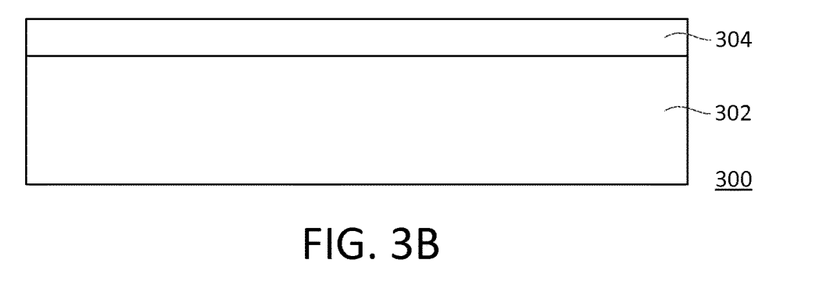

FIGS. 3A-J shows cross-sectional views of the manufacturing steps for producing an enhancement-mode HEMT device, according to one embodiment of the invention. In FIG. 3A, the formation of HEMT device 300 begins by providing a substrate 302. Substrate 302 can be silicon, silicon carbide, sapphire, bulk gallium nitride, or any other suitable substrate material for epitaxially growing a group III-V material. In FIG. 3B, a buffer layer 304, also known as a transition layer, is deposited on the substrate 302. Buffer layer 304 can be gallium nitride, aluminum gallium nitride, aluminum nitride, or any other suitable material for growing high-quality group III-V materials. Buffer layer 304 may be formed by any conventional means, such as placing substrate 302 in a MOCVD reactor and epitaxially growing the buffer layer 304 on the top surface of the substrate 302. Alternatively, the buffer layer 304 may be grown using molecular beam epitaxy (MBE). In one embodiment, forming the buffer layer 304 is optional and subsequent layers of semiconductor materials are grown directly on the substrate 302. For example, when the substrate 302 is bulk gallium nitride, layers of high quality gallium nitride can be grown directly on the substrate 302 without the need for buffer layer 304.

Figure 3C:
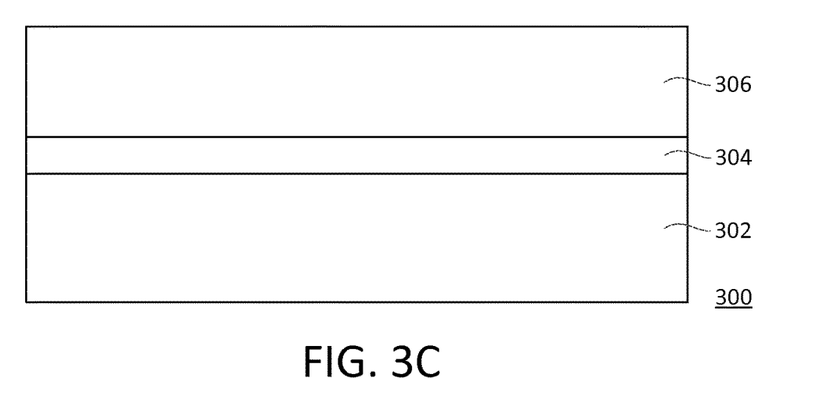

In FIG. 3C, a channel layer 306 is formed on the buffer layer 304. Channel layer 306 comprises a group III-V material, such as gallium nitride. Like the buffer layer 304, the channel layer 306 may be grown using any known process, including MOCVD or MBE. The thickness of the channel layer 306 will depend on the desired application of the HEMT device 300. For example, for a low power application applying 40V, the channel layer 306 may be grown to a thickness of 0.5 μm. However, for high power applications in excess of 1000V-1200V, the channel layer 306 should be grown to a greater thickness, such as 5 μm to 6 μm.

Figure 3D:
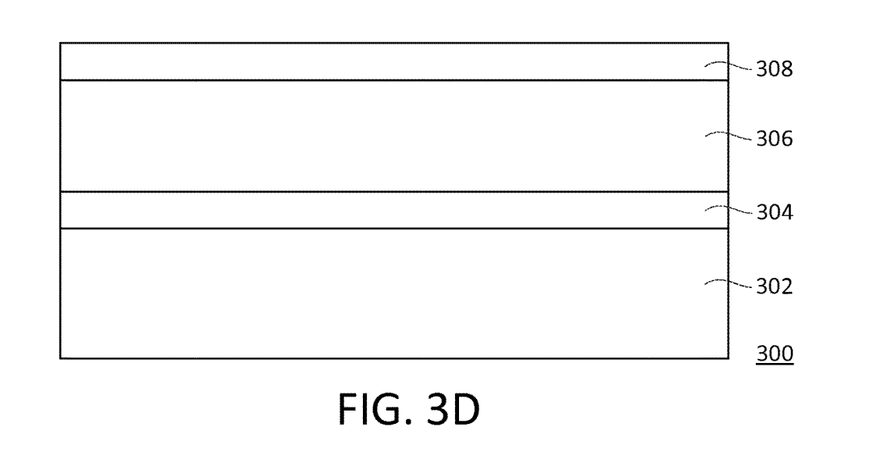

In FIG. 3D, a barrier layer 308 is formed on the channel layer 306. The barrier layer 308 comprises a group III-V material having a different polar property than the channel layer 306 to introduce a fixed charge at the heterojunction of the barrier layer 308 and the channel layer 306. As discussed above in connection with FIG. 2, the magnitude of the fixed charge can be controlled by varying the thickness, the chemical composition, or both, of the barrier layer 308. In one embodiment, the channel layer 306 comprises gallium nitride and the barrier layer 308 comprises aluminum gallium nitride. In one embodiment, the barrier layer 308 is formed to a thickness resulting in a fixed charge at the heterojunction corresponding to a mobile charge concentration of between $0$ $cm^{-2}$ and $3 \times 10^{12}$ $cm^{-2}$. In one embodiment, the aluminum gallium nitride barrier layer 308 is grown to a thickness of 5 nm. The barrier layer 308 may be grown using a similar process as the channel layer 306 and the buffer layer 304, namely MOCVD or MBE.

Figure 3E:
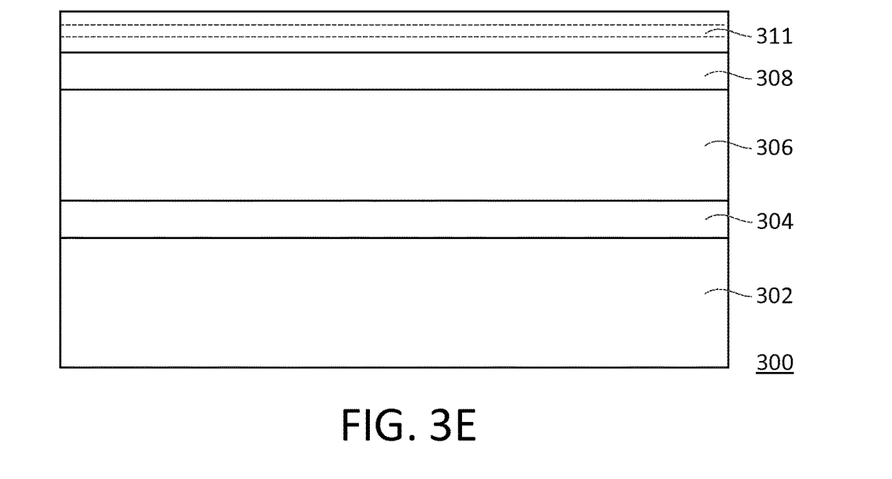

In FIG. 3E, an intervening layer 311 is formed on the barrier layer 308. The intervening layer 311 may comprise any material suitable to increase the fixed charge at the heterojunction of the HEMT device 300. In one embodiment, the channel layer 206 is gallium nitride, the barrier layer 308 is aluminum gallium nitride, and the intervening layer 311 comprises aluminum nitride. In another embodiment, the intervening layer 311 comprises a plurality of layers formed on the barrier layer 308, represented by the dotted lines shown in intervening layer 311 in FIGS. 3F-J. In one embodiment, the intervening layer 311 is formed to a thickness sufficient to increase the fixed charge at the heterojunction corresponding to a mobile charge concentration of between $7 \times 10^{12}$ $cm^{-2}$ and $2 \times 10^{13}$ $cm^{-2}$. In one embodiment, the aluminum nitride intervening layer 311 is grown to a thickness of 10 nm. The intervening layer 311 is preferably grown using ALD. However any other suitable deposition process may be used, including MOCVD and MBE.

Figure 3F:
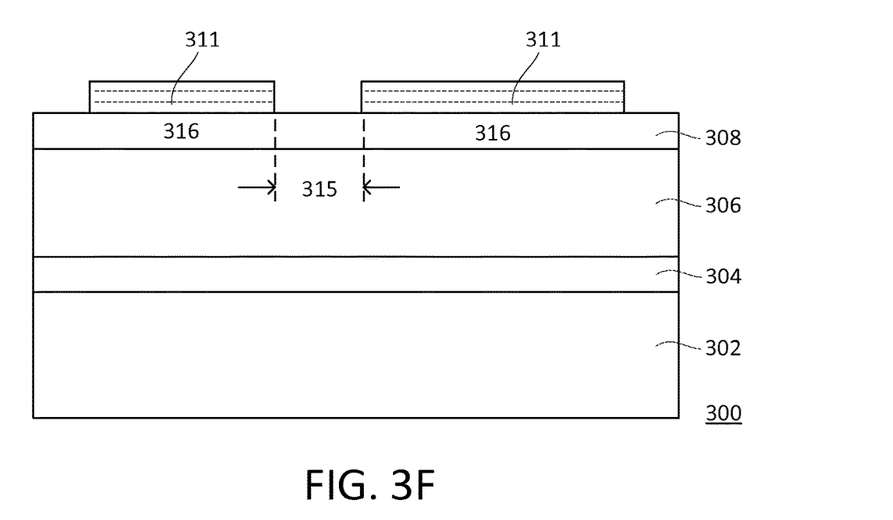

In FIG. 3F, portions of the intervening layer 311 are selectively removed using known photolithography and etching processes. In particular, the portion of the intervening layer 311 previously formed over a gated region 315 is removed, reducing the fixed charge of the gated region 315 and shifting the threshold voltage of the HEMT device 300 positive. However, the intervening layer 311 in non-gated region 316 remains, maintaining the enhanced fixed charge of the non-gated region 316 to improve the conductivity of the current carrying channel at the heterojunction of the HEMT device 300.

Figure 3G:
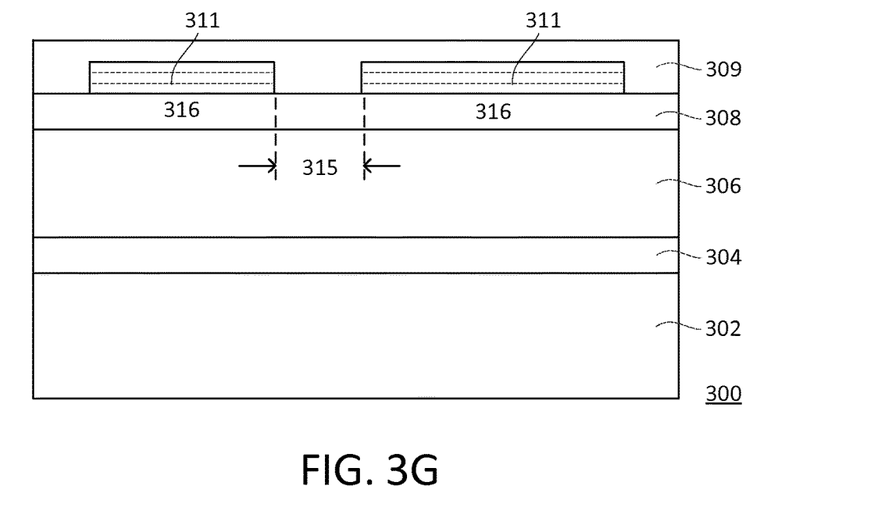
Figure 3H:
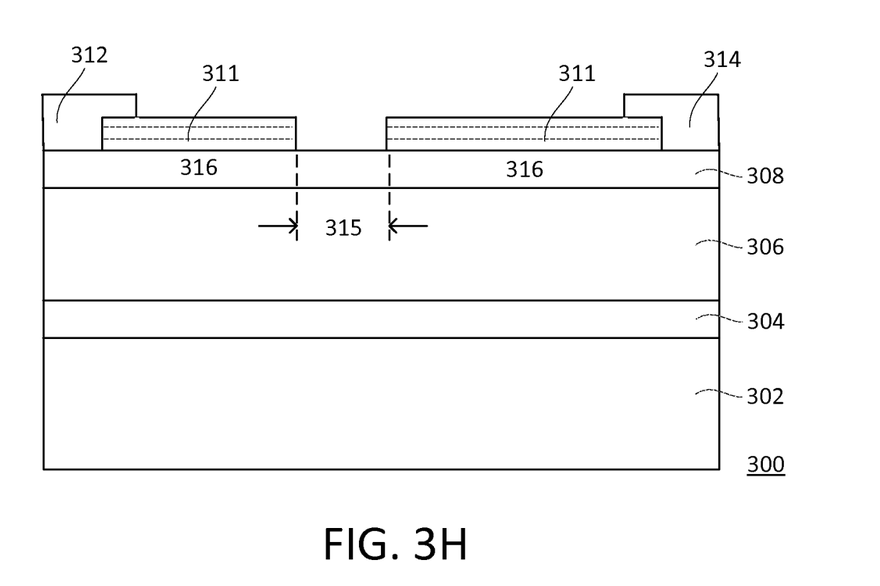

In FIG. 3G, an electrode layer 309 is formed. The electrode layer 309 comprises any suitable material for forming an ohmic contact with the underlying barrier layer 308, such as titanium, silicon, nickel, aluminum, tungsten, or any combination or alloy thereof. In one embodiment, the electrode layer 309 comprises layers of suitable metals to form a metal layer stack, such as titanium/aluminum, titanium/aluminum/titanium nitride (TiN), or titanium/aluminum/tungsten. In FIG. 3H, source electrode 312 and drain electrode 314 are formed using known photolithography and etching or lift-off techniques. Source electrode 312 and drain electrode 314 are subsequently annealed at high temperature, typically between 500° C. to 900° C., to form an ohmic contact with the underlying barrier layer 308.

Figure 3I:
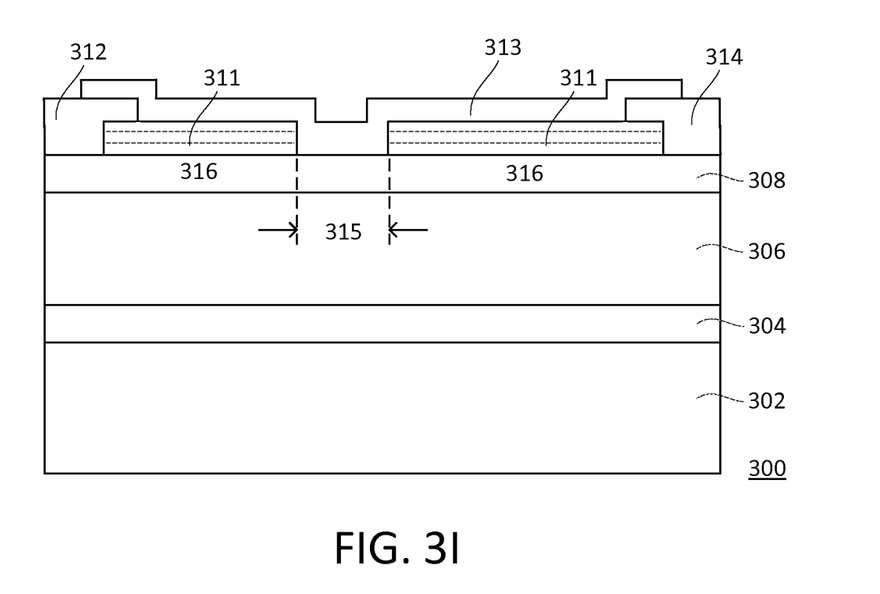

In FIG. 3I, a gate dielectric 313 is deposited over the intervening layer 311 in the non-gated region 316, and the barrier layer 308 in the gated region 315—which was previously exposed after selective etching of the intervening layer 311 in the processing step of FIG. 3F. The gate dielectric 313 may also cover a portion of the source electrode 312 and the drain electrode 314. The gate dielectric 313 may comprise any suitable dielectric material, or multiple layers of dielectric materials. In one embodiment, the gate dielectric 313 comprises aluminum oxide. In another embodiment, the gate dielectric 313 comprises silicon nitride. Gate dielectric 313 is deposited using any suitable method, including low-pressure chemical vapor deposition (LPCVD), ALD, plasma-enhanced chemical vapor deposition (PECVD), or MOCVD.

Figure 3J:
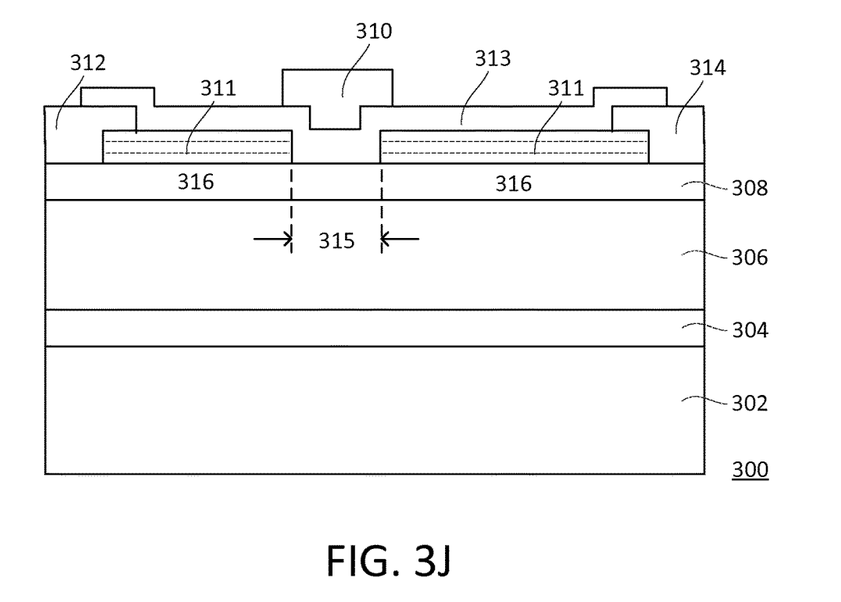

In FIG. 3J, a gate electrode 310 is formed on the gate dielectric 313 in the gated region 315, completing the HEMT device 300. In one embodiment, the gate electrode 310 may extend over the gate dielectric 313 into the non-gated region 316. The gate electrode 310 may comprise any suitable material, including titanium, nickel, aluminum, tungsten, molybdenum, titanium nitride, polysilicon (poly-Si) or any suitable material known to practitioners of the art. In one embodiment, the gate electrode 310 comprises layers of suitable metals to form a metal gate stack, such as titanium/aluminum, titanium nitride/aluminum, or titanium/titanium nitride/aluminum. The gate electrode 310 is formed by known patterning, deposition, and etching or lift-off techniques, similar to forming the source electrode 312 and the drain electrode 314.

Using the manufacturing steps illustrated in FIGS. 3A-J, the transistor characteristics of an HEMT device 300 formed in region of a wafer will be similar to the transistor characteristics of another HEMT device 300 formed in a different region of the wafer. In particular, the positive voltage bias required to turn the HEMT devices 300 on will be relatively consistent for all HEMT devices 300 formed throughout the wafer as the thickness of the barrier layer 308 in the gated region 315 are relatively uniform because the barrier layer 308 was not etched.

Figure 4:
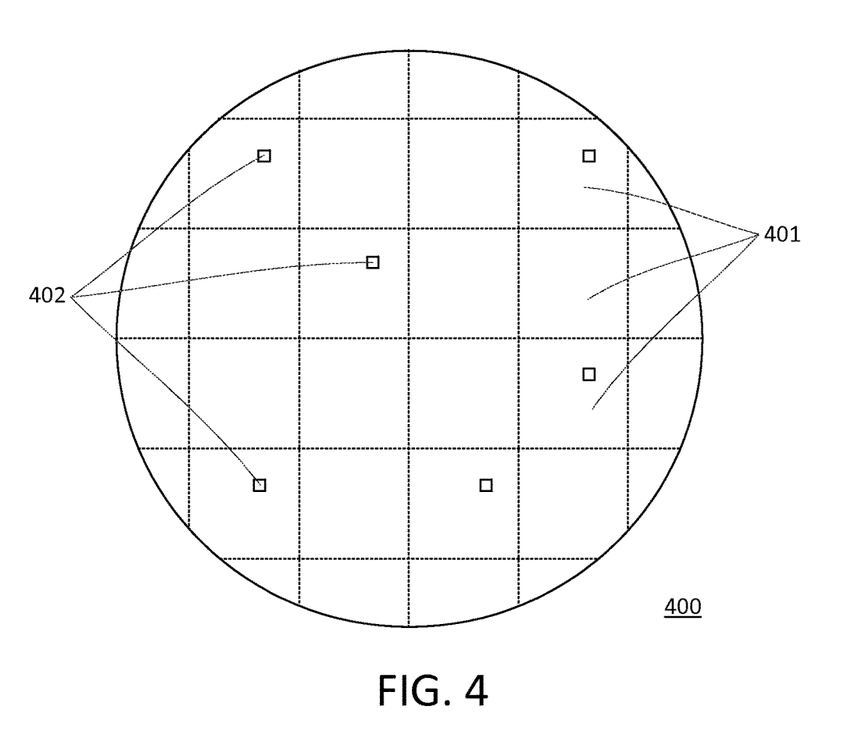
FIG. 4 shows a plan view of a wafer having a plurality of integrated circuit devices incorporating enhancement-mode HEMT devices, according to one embodiment of the invention.

FIG. 4 shows a plan view of a wafer 400 having a plurality of large area power devices or integrated circuit devices 401 incorporating enhancement-mode HEMT devices 402, according to one embodiment of the invention. Integrated circuit devices 401 can be any type of device, such as amplifiers, radio-frequency transmitters, and power controllers. Each of the integrated circuit devices 401 comprise one or more HEMT devices 402 manufactured using the process described in connection with FIGS. 3A-J. Only a handful of HEMT devices 402 are illustrated for simplicity. Additionally, the HEMT devices 402 are not drawn to scale.

As shown in FIG. 4, HEMT devices 402 are formed across the wafer 400. Ideally, each one of the integrated circuit devices 401 will have similar performance and device characteristics. In order to achieve this, the circuit elements that make up each of the integrated circuit devices 401, including HEMT devices 402, must also have similar characteristics. However, imperfections during the manufacturing process will result in variations in the characteristics of the circuit elements throughout the wafer 400.

As previously discussed, an HEMT device formed on one corner of the wafer 400 using the method disclosed by Kanamura et al. will have a drastically different threshold voltage compared to another HEMT device formed on the opposite corner of the wafer 400 due to the difficulty in controlling the etching depth of the barrier layer of the HEMT device. In contrast, the HEMT devices 402, formed using the manufacturing process described in FIGS. 3A-J will have a more uniform threshold voltage across the wafer 400 because the barrier layer is not intentionally etched. It is understood, of course, that the HEMT devices 402 will not have perfectly uniform characteristics, as previous manufacturing steps may result in some variation between the HEMT devices 402 across the wafer 400. For example, the surface of the channel layer underlying the barrier layer may have imperfections resulting in a non-planar surface on which the barrier layer is formed. As a result, the imperfections of the underlying channel layer will propagate to the barrier layer resulting in a non-uniform threshold voltage for the HEMT devices 402. However, the variation of the characteristics of the HEMT devices 402 is minimized compared to the prior art because the barrier layer of the HEMT devices 402 is not intentionally etched. As such, the HEMT device 402 is better suited for large-scale manufacturing than prior art devices.

Other objects, advantages and embodiments of the various aspects of the present invention will be apparent to those who are skilled in the field of the invention and are within the scope of the description and the accompanying Figures. For example, but without limitation, structural or functional elements might be rearranged, or method steps reordered, consistent with the present invention. Similarly, principles according to the present invention, and methods and systems that embody them, could be applied to other examples, which, even if not specifically described here in detail, would nevertheless be within the scope of the present invention.

For example, aspects of the present invention are equally applicable to depletion-mode HEMT devices and other enhancement-mode HEMT devices. Referring back to the HEMT device 200 shown in FIG. 2, the barrier layer 208 may be formed to be thicker, thereby increasing the polarization induced fixed charge at the heterojunction and turning the HEMT device 200 into a depletion-mode, or normally "on" device. As the barrier layer 208 is formed to be thicker, the charge concentration in the gated region 215 of a depletion-mode device is higher than that of an enhancement-mode HEMT device. Typically, the charge concentration in the gated region 215 of a depletion-mode device is between $5 \times 10^{12}$ cm$^{-2}$ and $2 \times 10^{13}$ cm$^{-2}$. As previously discussed in conjunction with FIG. 2, the intervening layer 211 formed in the non-gated region 216 of the HEMT device 200 will act to attract a higher concentration of mobile charge, increasing the conductivity of the current carrying channel in the non-gated region 216. As such, intervening layer 211 allows the depletion-mode HEMT device 200 to conduct a greater amount of current at a given negative threshold voltage, without etching into the barrier layer 208, resulting in an improved depletion-mode HEMT device.

Similarly, as another example for P-N junction gate HEMT devices, referring again to the HEMT device 200 shown in FIG. 2, gate electrode 210 may comprise a P-type semiconductor material in contact with the barrier layer 208 to form a P-N junction, along with a conductive contact formed above the semiconductor material to turn the HEMT device 200 into a P-N junction gate enhancement-mode HEMT device. Again, the thickness and/or composition of the barrier layer 208 may be adjusted to the desired threshold voltage, while the intervening layer 211 enhances the conductivity of the current carrying channel in the non-gated region 216, resulting in an improved P-N junction gate HEMT device.

What is claimed is:

1. A high electron mobility transistor (HEMT) device comprising:
   a heterojunction comprising a barrier layer formed on a channel layer;
   a plurality of intervening layers formed on a surface of the barrier layer opposite the channel layer in a non-gated region, wherein the plurality of intervening layers are non-insulative;
   a gate dielectric formed on the plurality of intervening layers in the non-gated region and the barrier layer in a gated region; and
   a gate electrode formed on the gate dielectric in the gated region,
   wherein the surface of the barrier layer is substantially planar in the gated region and the non-gated region, and the heterojunction has a first charge concentration in the non-gated region and a second charge concentration in the gated region, the plurality of intervening layers causing the first charge concentration to be greater than the second charge concentration.

2. The HEMT device of claim 1, wherein the barrier layer has substantially the same thickness in the non-gated region as the gated region.

3. The HEMT device of claim 1, wherein the first charge concentration is between $7 \times 10^{12}$ cm$^{-2}$ and $2 \times 10^{13}$ cm$^{-2}$.

4. The HEMT device of claim 1, wherein the second charge concentration is between 0 cm$^{-2}$ and $3 \times 10^{12}$ cm$^{-2}$.

5. The HEMT device of claim 1, wherein the second charge concentration is between $5\times10^{12}$ cm$^{-2}$ and $2\times10^{13}$ cm$^{-2}$.

6. The HEMT device of claim 1, wherein a positive bias voltage between 0V and 2V is applied to the gate electrode to turn the HEMT device on.

7. The HEMT device of claim 1, wherein the channel layer comprises a material selected from the group consisting of GaN, AlGaN, and InGaN.

8. The HEMT device of claim 1, wherein the barrier layer comprises a material selected from the group consisting of AlGaN, AlN, InAlN, and InAlGaN.

9. The HEMT device of claim 1, wherein the plurality of intervening layers comprises a material selected from the group consisting of GaN, AlGaN, AlN, InAlN, and InAlGaN.

10. The HEMT device of claim 1, wherein the gate dielectric is $Al_2O_3$.

11. A method of forming a high electron mobility transistor (HEMT) device, the method comprising:
    providing a substrate;
    forming a channel layer on the substrate;
    forming a barrier layer on the channel layer to create a heterojunction; and
    forming a plurality of intervening layers on a surface of the barrier layer opposite the channel layer in a non-gated region, wherein the plurality of intervening layers are non-insulative;
    forming a gate dielectric on the plurality of intervening layers in the non-gated region and the barrier layer in a gated region; and
    forming a gate electrode on the gate dielectric in the gated region,
    wherein the surface of the barrier layer is substantially planar in the gated region and the non-gated region, and
    the heterojunction has a first charge concentration in the non-gated region and a second charge concentration in the gated region, the plurality of intervening layers causing the first charge concentration to be greater than the second charge concentration.

12. The method according to claim 11, wherein the barrier layer has substantially the same thickness in the non-gated region as the gated region.

13. The method according to claim 11, wherein forming the plurality of intervening layers on the barrier layer in the non-gated region comprises:
    depositing the plurality of intervening layers on the barrier layer; and
    etching the plurality of intervening layers in the gated region to expose an upper surface of the barrier layer.

14. The method according to claim 13, wherein the plurality of intervening layers are deposited using atomic layer deposition.

15. The method according to claim 11, wherein the first charge concentration is between $7\times10^{12}$ cm$^{-2}$ and $2\times10^{13}$ cm$^{-2}$.

16. The method according to claim 11, wherein the second charge concentration is between 0 cm$^{-2}$ and $3\times10^{12}$ cm$^{-2}$.

17. The method according to claim 11, wherein the second charge concentration is between $5\times10^{12}$ cm$^{-2}$ to $2\times10^{13}$ cm$^{-2}$.

18. The method according to claim 11, wherein the channel layer comprises a material selected from the group consisting of GaN, AlGaN, and InGaN.

19. The method according to claim 11, wherein the barrier layer comprises a material selected from the group consisting of AlGaN, AlN, InAlN, and InAlGaN.

20. The method according to claim 11, wherein the plurality of intervening layers comprises a material selected from the group consisting of GaN, AlGaN, AlN, InAlN, and InAlGaN.

21. The method according to claim 11, wherein the gate dielectric is $Al_2O_3$.

22. The HEMT device of claim 1, wherein the plurality of intervening layers comprise different materials.

23. The method according to claim 11, wherein the plurality of intervening layers comprise different materials.

* * * * *